(12) United States Patent
Yan et al.

(10) Patent No.: US 9,698,302 B2
(45) Date of Patent: Jul. 4, 2017

(54) METHOD FOR MANUFACTURING ON COMPOUND GLASS SUBSTRATE MULTI-COLORED LED FOR USE IN VIDEO DISPLAY BOARD

(71) Applicants: Min Yan, Beijing (CN); Jun Cheng, Beijing (CN); Mingbo Zhou, Beijing (CN)

(72) Inventors: Min Yan, Beijing (CN); Jun Cheng, Beijing (CN); Mingbo Zhou, Beijing (CN)

(*) Notice: Subject to any disclaimer, the term of this patent is extended or adjusted under 35 U.S.C. 154(b) by 0 days.

(21) Appl. No.: 15/028,228

(22) PCT Filed: Dec. 2, 2015

(86) PCT No.: PCT/CN2015/000839
§ 371 (c)(1),
(2) Date: Apr. 8, 2016

(87) PCT Pub. No.: WO2016/086506
PCT Pub. Date: Jun. 9, 2016

(65) Prior Publication Data
US 2016/0329459 A1  Nov. 10, 2016

(30) Foreign Application Priority Data
Dec. 2, 2014  (CN) .......................... 2014 1 0724871

(51) Int. Cl.
*H01L 29/18*  (2006.01)
*H01L 21/66*  (2006.01)
(Continued)

(52) U.S. Cl.
CPC ............ *H01L 33/007* (2013.01); *H01L 22/14* (2013.01); *H01L 33/005* (2013.01)

(58) Field of Classification Search
CPC .......... G02B 5/201; G02B 5/22; G02B 5/285; G02B 5/28; H01L 21/76897
(Continued)

(56) References Cited

U.S. PATENT DOCUMENTS

2006/0132021 A1* 6/2006 Naberhuis ................. G09F 9/33
                                                                    313/493
2006/0197096 A1* 9/2006 Kerdiles ................. G02B 1/113
                                                                    257/79
(Continued)

*Primary Examiner* — Kimberly Rizkallah
*Assistant Examiner* — Brian Turner
(74) *Attorney, Agent, or Firm* — Buchanan Ingersoll & Rooney PC

(57) ABSTRACT

A method for manufacturing on a compound glass substrate a multi-colored LED for use in a video display board includes preparing a first masking layer on a compound glass substrate; depositing a first-color epitaxial layer on the first-color LED growing region and the first masking layer, to form a first-color LED; removing the first masking layer and the first-color epitaxial layer on the first masking layer; preparing a second masking layer, wherein the second masking layer is used to mask another region except a second-color LED growing region; depositing a second-color epitaxial layer on the second-color LED growing region and the second masking layer, to form a second-color LED; removing the second masking layer and the second-color epitaxial layer on the second masking layer; and grinding, cleaning, and performing an electrical test on a surface of the compound glass substrate.

5 Claims, 5 Drawing Sheets

(51) Int. Cl.
*H01L 33/20* (2010.01)
*H01L 33/62* (2010.01)
*H01L 21/329* (2006.01)
*H01L 29/45* (2006.01)
*H01L 33/00* (2010.01)

(58) Field of Classification Search
USPC .................................................. 438/5, 7, 29
See application file for complete search history.

(56) References Cited

U.S. PATENT DOCUMENTS

| | | | |
|---|---|---|---|
| 2008/0124823 A1* | 5/2008 | Ko | G02B 5/28 438/29 |
| 2008/0157098 A1* | 7/2008 | Noma | B81C 1/0023 257/80 |
| 2009/0029495 A1* | 1/2009 | Li | H01L 33/405 438/29 |
| 2009/0032490 A1* | 2/2009 | Tsai | G02B 5/201 216/12 |
| 2010/0187499 A1* | 7/2010 | Oh | B82Y 10/00 257/14 |
| 2013/0181240 A1* | 7/2013 | Chen | H01L 33/005 257/94 |

* cited by examiner

Third-color LED growing region

METHOD FOR MANUFACTURING ON COMPOUND GLASS SUBSTRATE MULTI-COLORED LED FOR USE IN VIDEO DISPLAY BOARD

BACKGROUND

Technical Field

The present invention relates to the field of semiconductors, and particularly, to a method for manufacturing on a compound glass substrate a multi-colored LED for use in a video display board.

Related Art

In a general process of manufacturing an LED video display board, the process is limited by back-end processing of general electronic processing, for example, an LED chip first needs to be packaged, and then, dual inline-pin package (DIP) or surface mount technology (SMT) assembly is performed; therefore, in the LED industry, it is unnecessary to pay attention to manufacturing of a mini chip, and therefore, LED does not have an opportunity to exploit its advantages of ultra-brightness, long service life, stable performance, and the like to the full while having an ultra-high density, and further cannot cover the application in the video display field of high-resolution mobile phone screens.

SUMMARY

An objective of the present invention is to provide a method for manufacturing on a compound glass substrate a multi-colored LED for use in a video display board.

According to a first aspect, an embodiment of the present invention provides a method for manufacturing on a compound glass substrate a multi-colored LED for use in a video display board, including:

preparing a first masking layer on a compound glass substrate, where the first masking layer is used to mask another region except a first-color LED growing region;

depositing a first-color epitaxial layer on the first-color LED growing region and the first masking layer, to form a first-color LED, where the first-color epitaxial layer includes a first-color N-type epitaxial layer and a first-color P-type epitaxial layer;

removing the first masking layer and the first-color epitaxial layer on the first masking layer;

preparing a second masking layer, where the second masking layer is used to mask another region except a second-color LED growing region;

depositing a second-color epitaxial layer on the second-color LED growing region and the second masking layer, to form a second-color LED, where the second-color epitaxial layer includes a second-color N-type epitaxial layer and a second-color P-type epitaxial layer;

removing the second masking layer and the second-color epitaxial layer on the second masking layer; and grinding, cleaning, and performing an electrical test on a surface of the compound glass substrate.

Preferably, the compound glass substrate includes a glass substrate and individualized epitaxial dice of crystal substrate accommodated at one side of the glass substrate; and the first masking layer, the second masking layer, and the third masking layer are prepared at one side of the individualized epitaxial dice of crystal substrate.

Further preferably, the individualized epitaxial dice of crystal substrate include:

any one of an SiC lining, an $Al_2O_3$ lining, and a GaAs lining.

Further preferably, the preparing a first masking layer on a compound glass substrate includes:

depositing $SiO_2$ on the compound glass substrate by means of physical vapor deposition;

performing step Mesa photoetching on the $SiO_2$, to expose $SiO_2$ on the first-color LED growing region; and etching the $SiO_2$ on the first-color LED growing region, to expose the individualized epitaxial dice of crystal substrate within the first-color LED growing region.

Further preferably, the preparing a second masking layer specifically includes:

depositing $SiO_2$ on the compound glass substrate by means of physical vapor deposition;

performing step Mesa photoetching on the $SiO_2$, to expose $SiO_2$ on the second-color LED growing region; and etching the $SiO_2$ on the second-color LED growing region, to expose the individualized epitaxial dice of crystal substrate within the second-color LED growing region.

Preferably, the deposition is specifically:

causing epitaxial layer growing by using a metal-organic chemical vapor deposition (MOCVD) method.

Preferably, before the grinding, cleaning, and performing an electrical test on a surface of the compound glass substrate, the method further includes:

preparing a third masking layer, where the third masking layer is used to mask another region except a third-color LED growing region;

depositing a third-color epitaxial layer on the third-color LED growing region and the third masking layer, to form a third-color LED, where the third-color epitaxial layer includes a third-color N-type epitaxial layer and a third-color P-type epitaxial layer; and removing the third masking layer and the third-color epitaxial layer on the third masking layer In the method for manufacturing on a compound glass substrate a multi-colored LED for use in a video display board provided in the present invention, epitaxial layers for growing different colors are selected separately by using masking layers, so as to form LEDs of different colors on different regions of a compound glass substrate. The method provided in the present invention has easy implementation, is low-cost, and is applicable to mass production and application. Epitaxial growth of multiple LEDs with a same color can be completed on the compound glass substrate at a time, to form an LED display module, which therefore ensures consistency between LED chips of colors in the LED display module, that is, ensures consistent and good display effect, so that a mean time between failure (MTBF) of an LED display panel achieves stability and reliability of 100 thousand hours.

DETAILED DESCRIPTION

The following further describes in detail technical solutions of the present invention with reference to the accompanying drawings and embodiments.

A method for manufacturing on a compound glass substrate a multi-colored LED for use in a video display board provided in the present invention is mainly applied to display panel manufacturing in the fields such as LED display, mini-spacing LED display, ultra-high density LED display, front-light-emitting LED television, front-light-emitting LED monitor, LED video wall, LED indicator, and LED special lighting.

Figure 1:
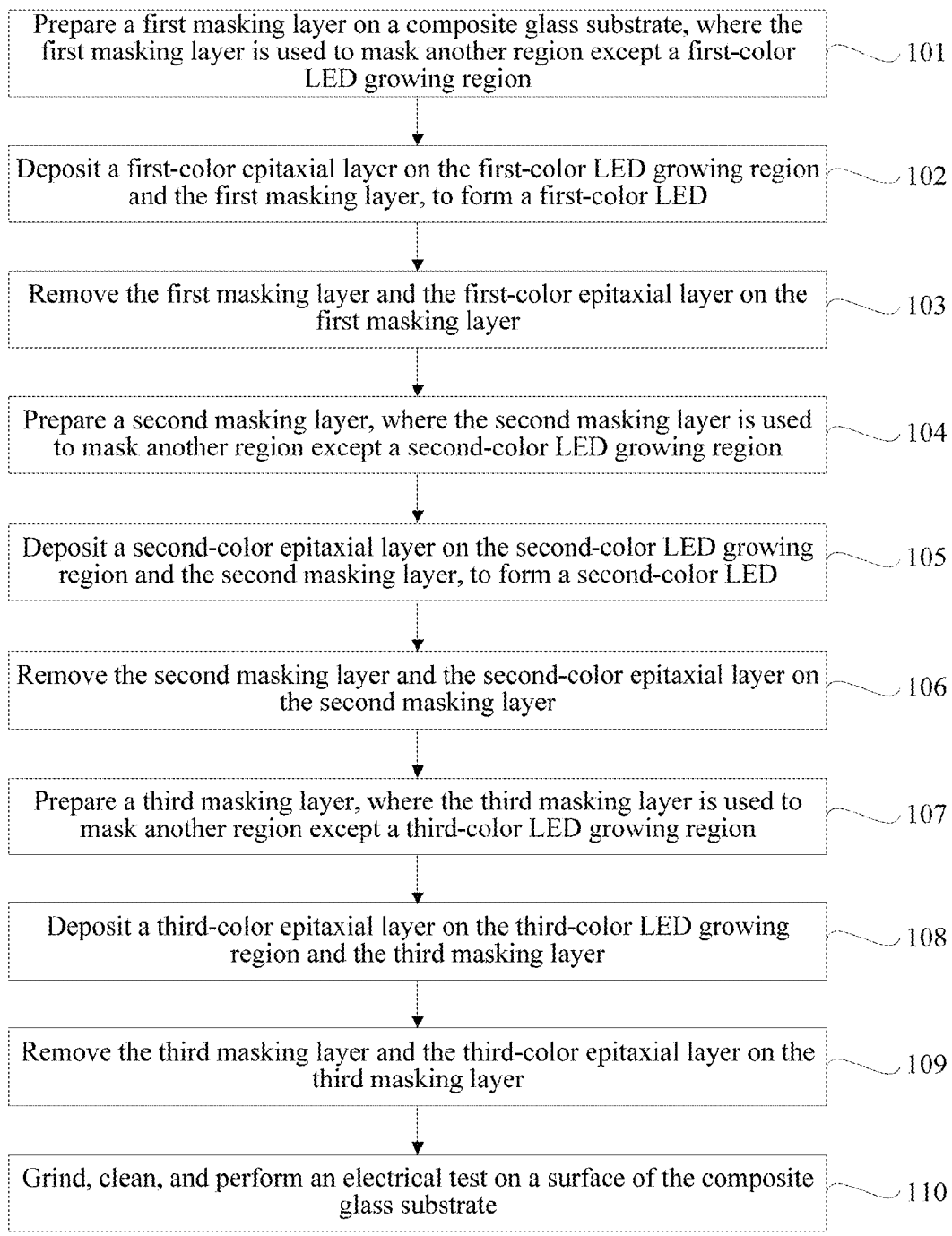
FIG. 1 is a flowchart of a method for manufacturing on a compound glass substrate a multi-colored LED for use in a video display board according to an embodiment of the present invention.

FIG. 1 is a flowchart of a method for manufacturing on a compound glass substrate a multi-colored LED for use in a video display board according to an embodiment of the present invention. In this embodiment, using a three-colored LED manufacturing method as an example for description, a person skilled in the art should know according to descriptions of the present invention that a method for preparing a single-colored, double-colored, or three-colored LED may be obtained by simplifying or repeating partial processing based on the method of the present invention.

The compound glass substrate used in this embodiment is a compound glass substrate manufactured by using a method for manufacturing a compound glass substrate for use in an epitaxial LED display module applied in patent No. 201410485949.5, and includes a glass substrate and an individualized epitaxial dice of crystal substrate accommodated at one side of the glass substrate, where the individualized epitaxial dice may include: an SiC lining, an $Al_2O_3$ lining, a GaAs lining, or the like.

It should be noted that, in the manufacturing method in the present invention, a color of an LED chip needed at each position on a video display board is preset, and the individualized epitaxial dice is preferably arranged into a matrix with equal spacing and is used for LED epitaxial growth.

The manufacturing method of the present invention includes the following steps:

Step 101: Prepare a first masking layer on a compound glass substrate, where the first masking layer is used to mask another region except a first-color LED growing region.

Figure 2:
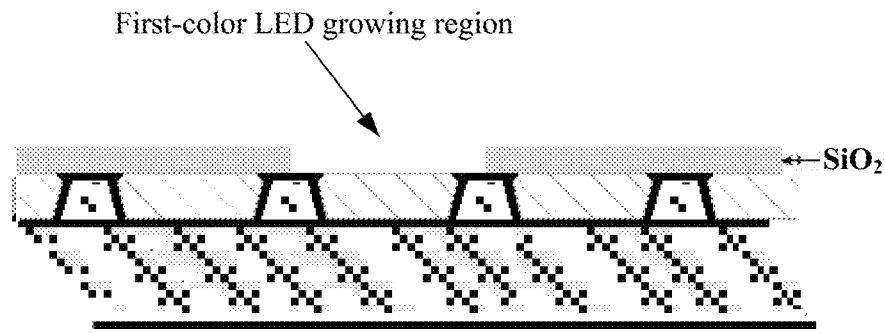
FIG. 2 is a first schematic diagram of a process of the manufacturing method according to this embodiment of the present invention.

Specifically, as shown in FIG. 2, the first masking layer is an $SiO_2$ layer, and is used to mask the another region except the first-color LED growing region. In this example, a first color is blue.

The preparing a first masking layer specifically includes:

depositing $SiO_2$ on one side, accommodated with the individualized epitaxial dice, of the compound glass substrate by means of physical vapor deposition;

performing step Mesa photoetching on the SiO2, to expose SiO2 on the first-color LED growing region; and etching the SiO2 on the first-color LED growing region, to expose the individualized epitaxial dice within the first-color LED growing region.

Step 102: Deposit a first-color epitaxial layer on the first-color LED growing region and the first masking layer, to form a first-color LED.

Figure 3:
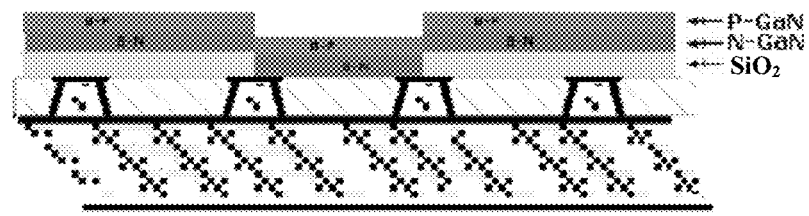
FIG. 3 is a second schematic diagram of a process of the manufacturing method according to this embodiment of the present invention.

Specifically, as shown in FIG. 3, the first-color epitaxial layer includes a first-color N-type epitaxial layer (B-N) and a first-color P-type epitaxial layer (B-P).

In this example, the epitaxial layer is GaN. An MOCVD method is used as the deposition method.

Step 103: Remove the first masking layer and the first-color epitaxial layer on the first masking layer.

Figure 4:
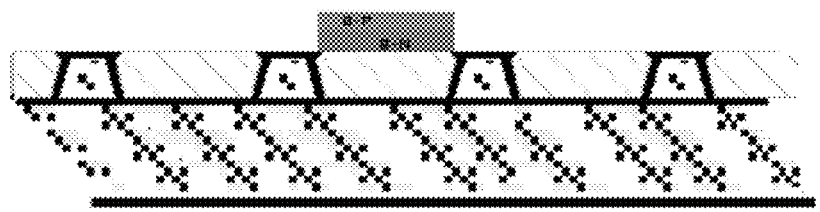
FIG. 4 is a third schematic diagram of a process of the manufacturing method according to this embodiment of the present invention.

Specifically, as shown in FIG. 4, only the B-N and B-P within the first-color LED growing region is kept after the removing, to form the first-color LED, that is, a blue LED.

Step 104: Prepare a second masking layer, where the second masking layer is used to mask another region except a second-color LED growing region.

Figure 5:
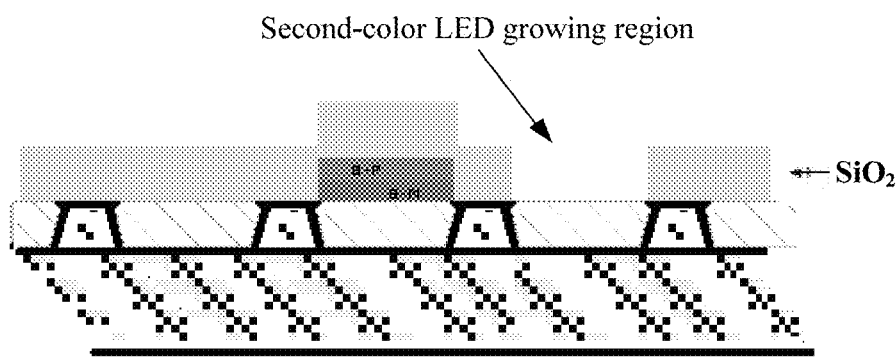
FIG. 5 is a fourth schematic diagram of a process of the manufacturing method according to this embodiment of the present invention.

Specifically, as shown in FIG. 5, the second masking layer is an $SiO_2$ layer, and is used to mask the another region except the second-color LED growing region. In this example, a second color is green.

The preparing a second masking layer specifically includes:

depositing $SiO_2$ on one side, accommodated with the individualized epitaxial dice, of the compound glass substrate by means of physical vapor deposition;

performing step Mesa photoetching on the $SiO_2$, to expose $SiO_2$ on the first-color LED growing region; and etching the $SiO_2$ on the first-color LED growing region, to expose the individualized epitaxial dice within the first-color LED growing region.

Step 105: Deposit a second-color epitaxial layer on the second-color LED growing region and the second masking layer, to form a second-color LED.

Figure 6:
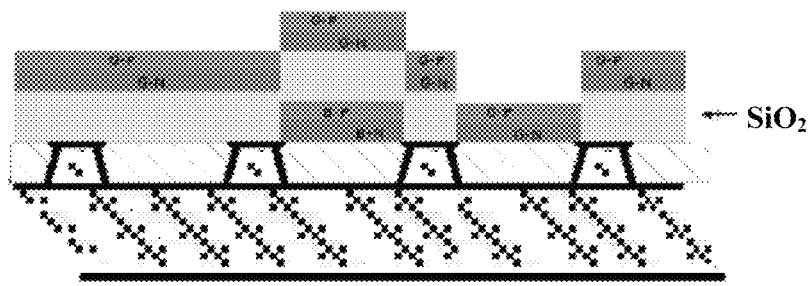
FIG. 6 is a fifth schematic diagram of a process of the manufacturing method according to this embodiment of the present invention.

Specifically, as shown in FIG. 6, the second-color epitaxial layer includes a second-color N-type epitaxial layer (G-N) and a second-color P-type epitaxial layer (G-P).

The deposition method for the epitaxial layer may also be implemented in an MOCVD manner.

Step 106: Remove the second masking layer and the second-color epitaxial layer on the second masking layer.

Figure 7:
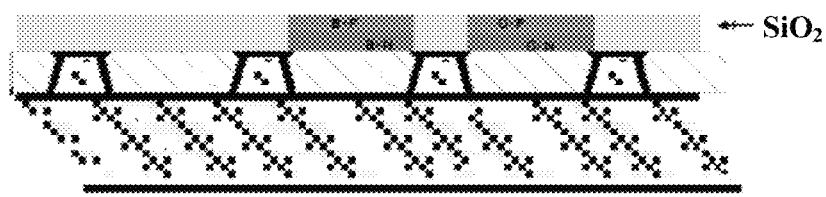
FIG. 7 is a sixth schematic diagram of a process of the manufacturing method according to this embodiment of the present invention.

Specifically, a removing method is the same as the method shown in step 103. As shown in FIG. 7, only G-N and G-P within the second-color LED growing region are kept after the removing, to form a second-color LED, that is, a green LED.

Step 107: Prepare a third masking layer, where the third masking layer is used to mask another region except a third-color LED growing region.

Figure 8:
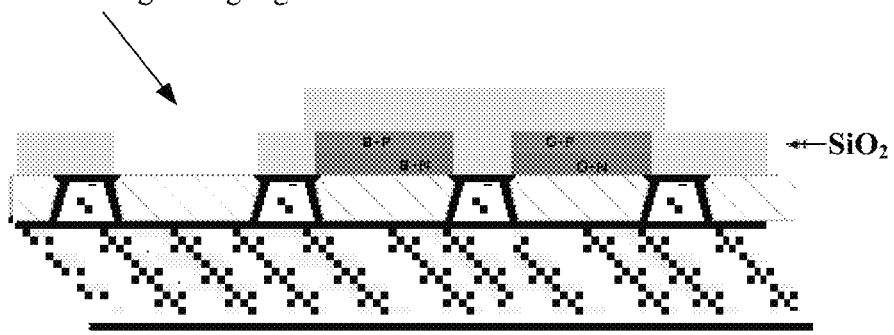
FIG. 8 is a seventh schematic diagram of a process of the manufacturing method according to this embodiment of the present invention.

Specifically, as shown in FIG. 8, the third masking layer is an $SiO_2$ layer, and is used to mask the another region except the third-color LED growing region. In this example, a third color is red.

The preparation method is the same as the preparation method of the foregoing two masking layers, and no further details are described herein again.

Step 108: Deposit a third-color epitaxial layer on the third-color LED growing region and the third masking layer, to form a third-color LED.

Figure 9:
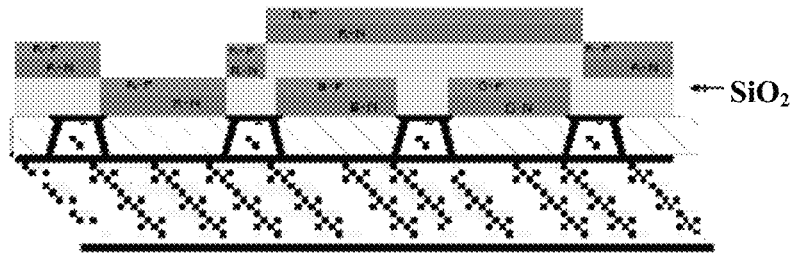
FIG. 9 is an eighth schematic diagram of a process of the manufacturing method according to this embodiment of the present invention.

Specifically, as shown in FIG. 9, the third-color epitaxial layer includes a third-color N-type epitaxial layer (R-N) and a third-color P-type epitaxial layer (R-P).

The deposition method for the epitaxial layer may also be implemented in an MOCVD manner.

Step 109: Remove the third masking layer and the third-color epitaxial layer on the third masking layer.

Figure 10:
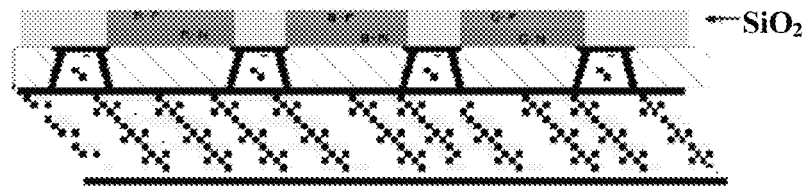
FIG. 10 is a ninth schematic diagram of a process of the manufacturing method according to this embodiment of the present invention.

Specifically, a removing method is the same as the method shown in step 103. As shown in FIG. 10, only R-N and R-P within the third-color LED growing region are kept after the removing, to form a third-color LED, that is, a red LED.

Therefore, the three-colored LED, for use in a video display board, needing to be manufactured in the present invention is obtained.

Step 110: Grind, clean, and perform an electrical test on a surface of the compound glass substrate.

It should be noted that, in the present invention, an MOCVD deposition process is used for LED epitaxy, so that multiple chips can be obtained by means of one time of epitaxy.

For the convenience of understanding, the following briefly describes a process of preparing the compound glass substrate.

Figure 11:
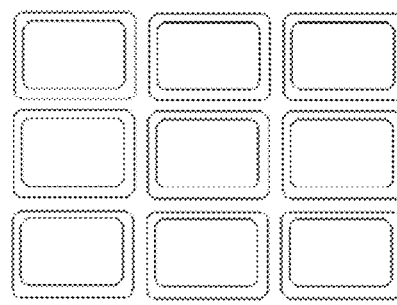
FIG. 11 and FIG. 12 respectively are a schematic cross-sectional view and a front view of a pit-matrix glass plate formed through thermo-compressionally shaping.
Figure 12:
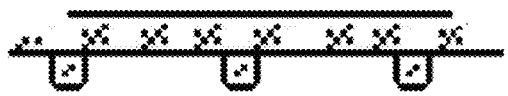

First, a glass plate is prepared, and a pit matrix is formed on the glass plate through thermo-compressionally shaping. The matrix is shown in FIG. 11. In an example, the pits have a same size and depth, and spacing between the pits is the same.

Figure 13:
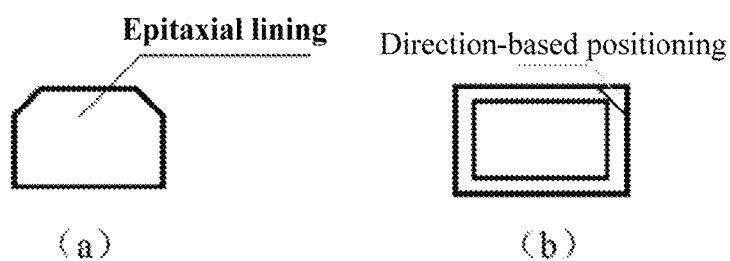
FIG. 13(*a*) and FIG. 13(*b*) respectively are a cross-sectional view and a top view of a lining.

Then, individualized epitaxial dice of crystal substrate are prepared. Material of the dice may be SiC, $Al_2O_3$, GaAs, or the like. The dice are generally 80 micrometers thick, and in a rectangular shape. FIG. 13(*a*) and FIG. 13(*b*) respectively are a cross-sectional view and a top view of the dice. The dice may be obtained by cutting a large made-up sheet by using a laser.

A graphic lining is mounted onto a WAFER interleaving paper. The interleaving paper obtained after mounting is shown in FIG. 13.

Figure 14:
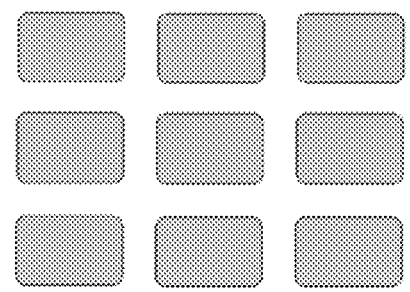
FIG. 14 shows a mounted interleaving paper.
Figure 15:
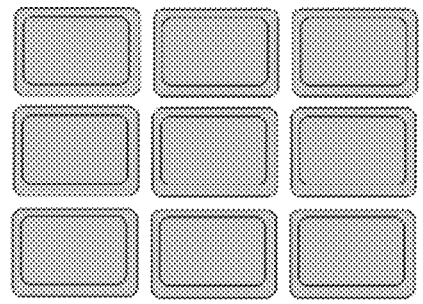
FIG. 15 and FIG. 16 respectively are a front view and a cross-sectional view of a glass plate obtained after linings are mounted onto pits.

A needle printer is used to mount the dice from the WAFER into the pit in the glass plate. The front view and the rear view of the glass plate after the dice are mounted onto the pits are respectively shown in FIG. 14 and FIG. 15.

Figure 16:
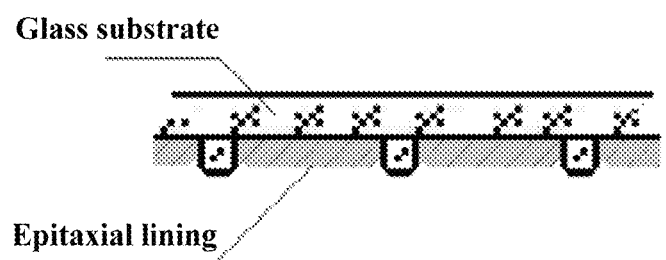
Figure 17:
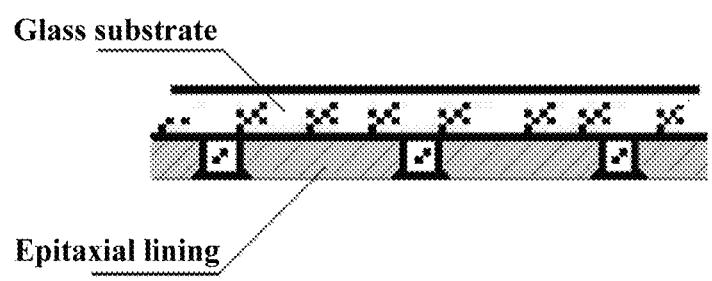
FIG. 17 and FIG. 18 respectively are a cross-sectional view and a front view of a glass plate formed through high-temperature thermo-compressionally shaping.
Figure 18:
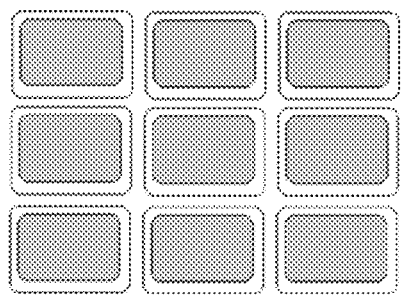

Finally, thermo-reshaping is performed on the glass plate until the compound glass substrate is formed. In a process of positioning and thermo-compressionally shaping in a mould, the glass is in a melting state. In this case, the glass plate is separately shown in FIG. 16 and FIG. 17. Cooling, mould striping, grinding and polishing a surface integrated with the individualized epitaxial dice, high-temperature melt-down and annealing, cleaning, drying, testing, and packaging are performed sequentially.

In the method for manufacturing on a compound glass substrate a multi-colored LED for use in a video display board provided in the present invention, epitaxial layers for growing different colors are selected separately by using masking layers, so as to form LEDs of different colors on different regions of a compound glass substrate. The method provided in the present invention has easy implementation, is low-cost, and is applicable to mass production and application. Epitaxial growth of multiple LEDs with a same color can be completed on the compound glass substrate at a time, to form an LED display module, which therefore ensures consistency between LED chips of colors in the LED display module, that is, ensures consistent and good display effect, so that an MTBF of an LED display panel achieves stability and reliability of 100 thousand hours.

In the foregoing embodiment, the parameters such as the temperature, the concentration, and the time are only a specific embodiment, and do not limit the present invention. A person skilled in the art can adjust the parameters without creative efforts, to obtain effect the same as that in the present invention. Therefore, adjustment on the parameter values shall fall within the protection scope of the present invention.

The foregoing specific implementation manners are details descriptions of the objective, the technical solutions, and the beneficial effects of the present invention. It should be understood that, the foregoing descriptions are merely specific implementation manners of the present invention, but are not intended to limit the present invention. Any modification, equivalent replacement, or improvement made within the spirit and principle of the present disclosure shall fall within the protection scope of the present invention.

What is claimed is:

1. A method for manufacturing on a compound glass substrate a multi-colored LED for use in a video display board, the compound glass substrate comprising a glass substrate and an individualized epitaxial dice of crystal substrate accommodated at one side of the glass substrate, the method comprising:

preparing a first masking layer on a compound glass substrate, wherein the first masking layer is used to mask another region except a first-color LED growing region;

depositing a first-color epitaxial layer on the first-color LED growing region and the first masking layer, to form a first-color LED, wherein the first-color epitaxial layer comprises a first-color N-type epitaxial layer and a first-color P-type epitaxial layer;

removing the first masking layer and the first-color epitaxial layer on the first masking layer;

preparing a second masking layer, wherein the second masking layer is used to mask another region except a second-color LED growing region;

depositing a second-color epitaxial layer on the second-color LED growing region and the second masking layer, to form a second-color LED, wherein the second-color epitaxial layer comprises a second-color N-type epitaxial layer and a second-color P-type epitaxial layer;

removing the second masking layer and the second-color epitaxial layer on the second masking layer; and grinding, cleaning, and performing an electrical test on a surface of the compound glass substrate;

wherein the first masking layer, the second masking layer, and the third masking layer are prepared at one side of the individualized epitaxial dice of crystal substrate;

the preparing of the first masking layer on the compound glass substrate comprises:

depositing $SiO_2$ on the compound glass substrate by means of physical vapor deposition;

performing step Mesa photoetching on the $SiO_2$, to expose $SiO_2$ on the first-color LED growing region; and etching the $SiO_2$ on the first-color LED growing region, to expose the individualized epitaxial dice of crystal substrate within the first-color LED growing region.

2. The method according to claim 1, wherein the individualized epitaxial dice of crystal substrate comprise:

any one of an SiC lining, an $Al_2O_3$ lining, and a GaAs lining.

3. The method according to claim 1, wherein the deposition is specifically:

causing epitaxial layer growing by using a metal-organic chemical vapor deposition (MOCVD) method.

4. The method according to claim 1, wherein before the grinding, cleaning, and performing an electrical test on a surface of the compound glass substrate, the method further comprises:

preparing a third masking layer, wherein the third masking layer is used to mask another region except a third-color LED growing region;

depositing a third-color epitaxial layer on the third-color LED growing region and the third masking layer, to form a third-color LED, wherein the third-color epitaxial layer comprises a third-color N-type epitaxial layer and a third-color P-type epitaxial layer; and removing the third masking layer and the third-color epitaxial layer on the third masking layer.

5. A method for manufacturing on a compound glass substrate a multi-colored LED for use in a video display board, the compound glass substrate comprising a glass substrate and an individualized epitaxial dice of crystal substrate accommodated at one side of the glass substrate, the method comprising:

preparing a first masking layer on a compound glass substrate, wherein the first masking layer is used to mask another region except a first-color LED growing region;

depositing a first-color epitaxial layer on the first-color LED growing region and the first masking layer, to form a first-color LED, wherein the first-color epitaxial layer comprises a first-color N-type epitaxial layer and a first-color P-type epitaxial layer;

removing the first masking layer and the first-color epitaxial layer on the first masking layer;

preparing a second masking layer, wherein the second masking layer is used to mask another region except a second-color LED growing region;

depositing a second-color epitaxial layer on the second-color LED growing region and the second masking layer, to form a second-color LED, wherein the second-color epitaxial layer comprises a second-color N-type epitaxial layer and a second-color P-type epitaxial layer;

removing the second masking layer and the second-color epitaxial layer on the second masking layer; and grinding, cleaning, and performing an electrical test on a surface of the compound glass substrate;

wherein the first masking layer, the second masking layer, and the third masking layer are prepared at one side of the individualized epitaxial dice of crystal substrate;

wherein the preparing of the second masking layer specifically comprises:

depositing $SiO_2$ on the compound glass substrate by means of physical vapor deposition;

performing step Mesa photoetching on the $SiO_2$, to expose $SiO_2$ on the second-color LED growing region; and etching the $SiO_2$ on the second-color LED growing region, to expose the individualized epitaxial dice of crystal substrate within the second-color LED growing region.

\* \* \* \* \*